(12) United States Patent
Fefer et al.

(10) Patent No.: US 9,097,758 B2
(45) Date of Patent: Aug. 4, 2015

(54) CONNECTION QUALITY VERIFICATION FOR INTEGRATED CIRCUIT TEST

(75) Inventors: Yefim-Haim Fefer, Petah-Tikva (IL); Sergey Sofer, Reshon Letzion (IL); Boris Zapesochini, Jerusalem (IL)

(73) Assignee: Freescale Semiconductor, Inc., Austin, TX (US)

( * ) Notice: Subject to any disclaimer, the term of this patent is extended or adjusted under 35 U.S.C. 154(b) by 916 days.

(21) Appl. No.: 13/255,523

(22) PCT Filed: Mar. 31, 2009

(86) PCT No.: PCT/IB2009/051356
§ 371 (c)(1),
(2), (4) Date: Sep. 9, 2011

(87) PCT Pub. No.: WO2010/112976
PCT Pub. Date: Oct. 7, 2010

(65) Prior Publication Data
US 2012/0038367 A1    Feb. 16, 2012

(51) Int. Cl.
  *G01R 31/04*    (2006.01)
  *G01R 31/28*    (2006.01)
  G01R 31/317    (2006.01)
(52) U.S. Cl.
  CPC ........ *G01R 31/2853* (2013.01); *G01R 31/2884* (2013.01); *G01R 31/31717* (2013.01)
(58) Field of Classification Search
  CPC .......... G01R 31/2832; G01R 31/2834; G01R 31/2836; G01R 31/2839; G01R 31/2841; G01R 31/2843; G01R 31/2844; G01R 31/2851; G01R 31/2853; G01R 31/2856; G01R 31/2884; G01R 31/2886
  USPC ............. 324/762.02, 756.03, 762.01, 756.02, 324/537, 754.03, 762.05, 750.3, 754.07, 324/759.03
See application file for complete search history.

(56) References Cited

U.S. PATENT DOCUMENTS

| | | | |
|---|---|---|---|
| 4,997,552 A * | 3/1991 | Schlinkmann et al. | ....... 209/552 |
| 5,068,604 A * | 11/1991 | Van de Lagemaat | ......... 324/537 |
| 5,498,972 A * | 3/1996 | Haulin | ..................... 324/754.03 |
| 7,042,237 B2 | 5/2006 | Hsiao | |
| 2006/0217906 A1 | 9/2006 | Barbara et al. | |

FOREIGN PATENT DOCUMENTS

JP    2008-076356 A    4/2008
KR    10-2005-0014137 A    2/2005

OTHER PUBLICATIONS

International Search Report and Written Opinion correlating to PCT/IB2009/051356 dated May 2, 2011.

* cited by examiner

*Primary Examiner* — Melissa Koval
*Assistant Examiner* — Daniel Miller

(57) ABSTRACT

An integrated circuit device comprising a semiconductor die contained in a package. The integrated circuit device includes one or more internal connection verification modules for asserting a poor connection signal for the test apparatus in response to a voltage difference between a voltage at a corresponding internal power supply node and a reference voltage, the voltage difference being indicative of a poor connection of power supply to one of power supply terminals on the package. The test apparatus can include an indicator or a sorting element for rejecting or accepting the integrated circuit device in response to logic signals indicative of the presence or absence of a defect accompanied by non-assertion of the poor connection signal, and for processing the integrated circuit device distinctively in response to assertion of the poor connection signal.

20 Claims, 5 Drawing Sheets

CONNECTION QUALITY VERIFICATION FOR INTEGRATED CIRCUIT TEST

FIELD OF THE INVENTION

This invention relates to connection quality verification for integrated circuit test and more specifically to an integrated circuit device adapted for connection quality verification, and to test apparatus and to a method of testing for such an integrated circuit device.

BACKGROUND OF THE INVENTION

An integrated circuit ('IC') device comprises a semiconductor die containing many IC components such as registers and functional blocks, interconnecting logic gates such as AND, OR gates and memory components such as flip-flops. Electrical conductor nets on the die connect the IC components together and to contact pads at the surface of the die. The IC device may have more than one power domain, each having its own power supply.

The IC die is housed in a package which supports and protects the IC die and provides external electrical terminals. The IC device is assembled on a support in a product using the package terminals to make electrical connections for logic signals and power supply between the contact pads of the IC and external circuits. The power supply connections of each power domain may have one or more corresponding package terminals.

Often, the IC package is of surface mount technology, which facilitates mounting the package directly on a support such as a printed circuit board ('PCB'), for example. There are several types of surface mount package, including packages having electrical terminals which are short pins or leads of various styles, flat contacts or an array of solder balls ('BGA's), for example. Typically, the device is placed on a PCB that carries conductive pads in a pattern that matches the package terminals, and the assembly is then heated, either in a reflow oven or by an infrared heater, causing solder to melt, making the electrical connections between the package terminals and the PCB and securing the package mechanically to the PCB.

Whatever the type of package, the complexity of the IC necessitates extensive testing of the functioning of the IC by the IC manufacturer before it is delivered commercially for assembly, which may be performed by a customer, for example. Typically, this testing is performed by automatic test equipment ('ATE') having a high degree of automation and the IC device itself is designed to facilitate the operation of such ATE by techniques globally referred to as design-for-test. In addition, the customer usually tests the assembled product comprising a PCB, for example, with the IC mounted on it, if only to check the quality of the logic signal connections.

The tests are intended to eliminate as many defective devices and products as possible. However, they are also intended to avoid eliminating devices and products which would in fact function correctly or to identify products that could be reworked to function correctly.

A known test procedure includes the open-short test algorithm, which is implemented in many test equipments to detect logic signal connection failures. Another known test procedure is described in US patent specification U.S. Pat. No. 7,042,237 which detects incorrect logic signal connections of the device under test and also signals incorrect positioning of the device in the test interface, avoiding unjustified rejection of the device when an apparent device fault is in fact due to human error.

SUMMARY OF THE INVENTION

The present invention provides an integrated circuit device, a product including an integrated circuit device, an apparatus for testing and a method of testing as described in the accompanying claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
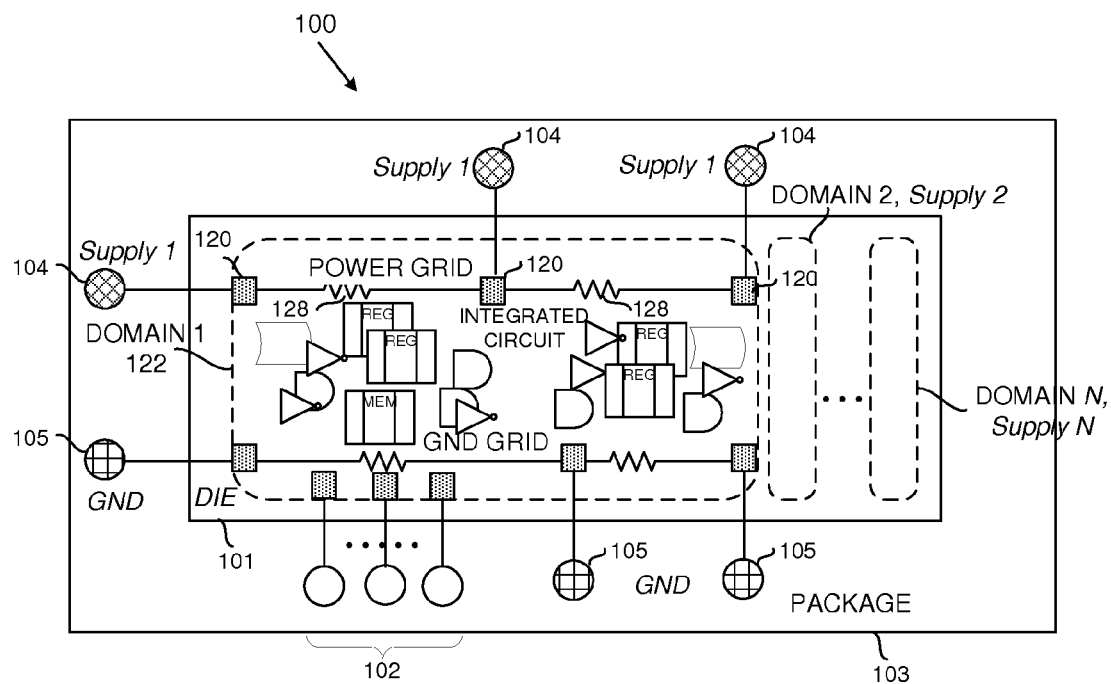
FIG. 1 is a schematic diagram of an integrated circuit device in accordance with an embodiment of the invention, given by way of example.

FIG. 1 shows an integrated circuit ('IC') device 100 comprising a semiconductor die 101 contained in a package 103. The package presents external terminals for making electrical connections between the IC and circuits external to the package in use of the IC. The external terminals include logic signal terminals 102 for logic signals and at least two power supply terminals for supplying power to interconnected power grid elements in a given power domain of the integrated circuit. The power supply terminals for each domain include a plurality (at least two) of voltage supply terminals 104 (FIG. 1 shows three voltage supply terminals by way of example) and a plurality (at least two) of ground connection terminals 105 (FIG. 1 shows three ground connection terminals by way of example). Low but finite resistance electrical interconnections 128 are made in the IC die between at least two nodes 120 connected with respective power supply terminals 104 within the power nets of each power domain and form the domain power grid elements. Similar connection structures with at least two nodes 120 may be adopted for the ground grid elements, which are not shown for simplicity. In this embodiment of the invention, the external terminals 102, 104 and 105 are formed by an array of solder balls ('BGA's), although it will be appreciated that the present invention can be applied to IC packages with other forms of external terminals. In this example of an embodiment of the invention N power domains are shown, but it will be understood that the number of power domains may vary from one to any manageable number.

In this example of an embodiment of the invention, the power supply and ground terminals include three solder balls for the power supply and three solder balls for the ground. This embodiment of the invention is applicable to testability where a power domain has two or more solder balls 104 or 105 for each testable grid. In this situation, interconnections in the power grids may enable one voltage or ground supply terminal to supply power to another part of the power domain whose power supply is degraded by a poorly connected voltage or ground supply terminal, and perturb the detection of functional defects by conventional test processes. Although only three logic terminal solder balls 102 are shown in the drawing for the sake of simplicity, it will be appreciated that a typical BGA will comprise many more logic terminal balls, for example one or two hundred or more.

Figure 2:
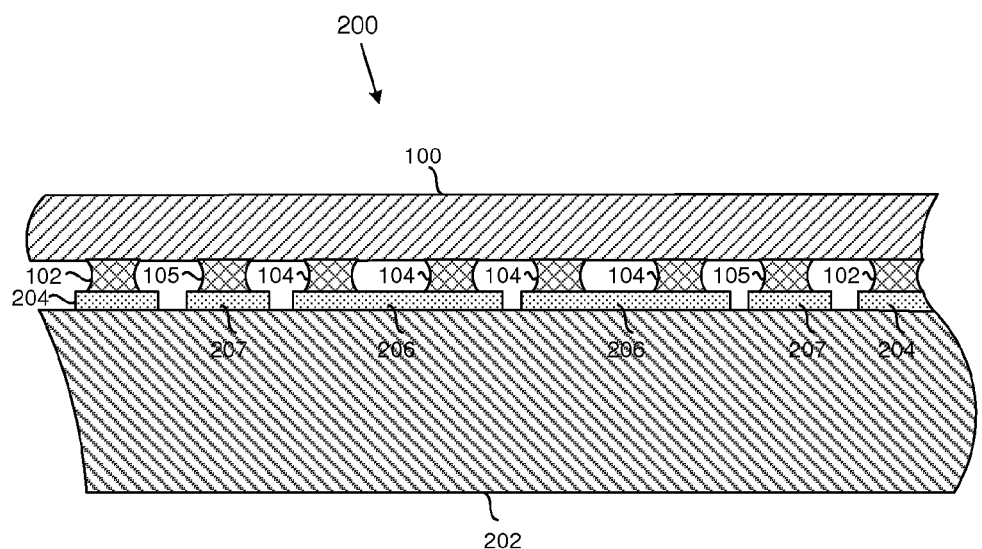
FIG. 2 is a schematic diagram of a product including an integrated circuit device in accordance with an embodiment of the invention, given by way of example.

FIG. 2 shows a simplified side view or cross-section of a product 200 comprising the IC device 100 of FIG. 1 after mounting the package directly on a printed circuit board ('PCB') 202, by way of example. The IC device has been placed on the PCB 202 that carries conductors 204, 206 and 207 in a pattern that matches the package terminals 102, 104 and 105 respectively. Those skilled in the art will appreciate that the assembly may be heated, either in a reflow oven or by an infrared heater, causing the solder of the BGA array to melt, to make the electrical connections between the package terminals 102, 104 and 105 and the PCB pads 204, 206, and 207, securing the IC device package 100 mechanically to the PCB 202.

Figure 3:
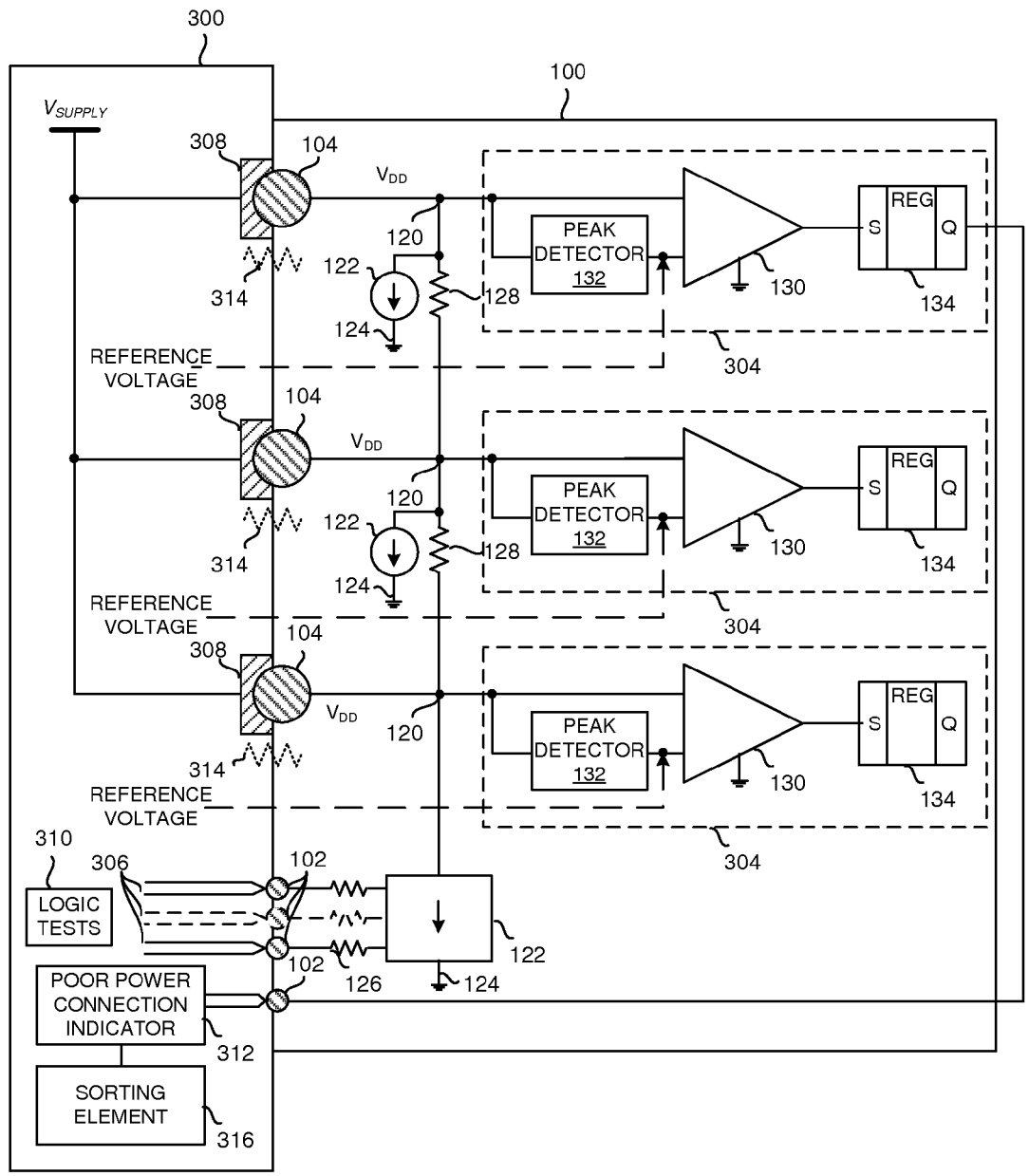
FIG. 3 is a schematic diagram of an integrated circuit device and test apparatus in accordance with an embodiment of the invention, given by way of example.

FIG. 3 shows an automatic test equipment ('ATE') apparatus 300, in accordance with an embodiment of the present invention, with an integrated circuit device 100 installed in the test apparatus for final testing the IC device 100 before delivery. A single power domain of the integrated circuit device 100 is shown, for simplicity, which receives from the external apparatus 300 a test voltage $V_{SUPPLY}$ applied to the power supply nodes 120 connected with the voltage supply terminals 104. A respective internal connection verification module 304 is connected to each node 120 for asserting a poor power connection signal for the external apparatus 300 in response to a voltage difference between a voltage at or across the corresponding power supply node or nodes 120 and a reference voltage, the voltage difference being indicative of a poor connection of the power supply $V_{SUPPLY}$ to at least one of the power supply terminals 104. A similar arrangement may be provided for the ground connection grid.

In more detail, the test apparatus 300 includes probes 306 which in use contact the logic terminal balls 102 of the IC device package 100 and test access points ('TAP') 308 which in use contact the power supply terminal ball or balls 104 of the IC device package 100. The ATE apparatus applies a power supply voltage $V_{SUPPLY}$ across the TAPs, or between the TAPs and ground, to provide power supply to the IC device package 100 under test through the solder ball or balls 104. The ATE apparatus also includes a logic test module 310 which applies signals to the device 100 and detects the responses of the device 100 through the probes 306 and the logic signal terminals 102 of the BGA according to defined test procedures. The test procedures may include an open-short test algorithm to detect logic signal connection failures.

The test apparatus 300 includes a poor power connection indication element 312 for providing an indication in response to assertion of the poor power connection signal from the internal connection verification module 304. The assertion of the poor power connection signal from the internal connection verification module 304 is used to warn an operator that a possible diagnosis of a defect in the IC device 100 could be due to a poor contact of one of the TAPs 308 with corresponding power supply terminal 104 and not necessarily a real functional defect in the IC device 100 itself. In another embodiment of the invention, such a poor power connection indication located in the ATE and functioning on dedicated external signals from the IC 100 is replaced by a poor power connection indication at the ATE using signals stored in internal registers in the IC 100 which are read out by a standard read-out procedure. Instead of, or as well as, warning an operator, the test apparatus 300 may include a sorting element 316 for rejecting or accepting the integrated circuit device 100 in response to logic signals indicative of the presence or absence of a defect accompanied by non-assertion of the poor connection signal, and for processing the integrated circuit device 100 distinctively in response to assertion of said poor connection signal, for example by re-establishing the contact between the TAPs 308 and the solder balls 104 and 105.

It has been established that, in the absence of detection of a poor ATE power supply connection a significant proportion of IC devices under test are unnecessarily rejected because of poor ATE power supply connection, which presents a resistance between the TAP 308 and the power supply terminal 104, as illustrated by the resistor symbol 314 shown in dotted lines in FIG. 3. The reduction in the proportion of IC devices 100 under test unnecessarily rejected by such detection of a poor test power supply connection has been found to increase significantly the non-rejected yield of manufactured IC devices. In addition, it is also possible to avoid poor test power supply connection masking certain real functional defects in the IC device and hence to avoid delivering to a customer devices with defects which would go undetected from this cause.

Figure 4:
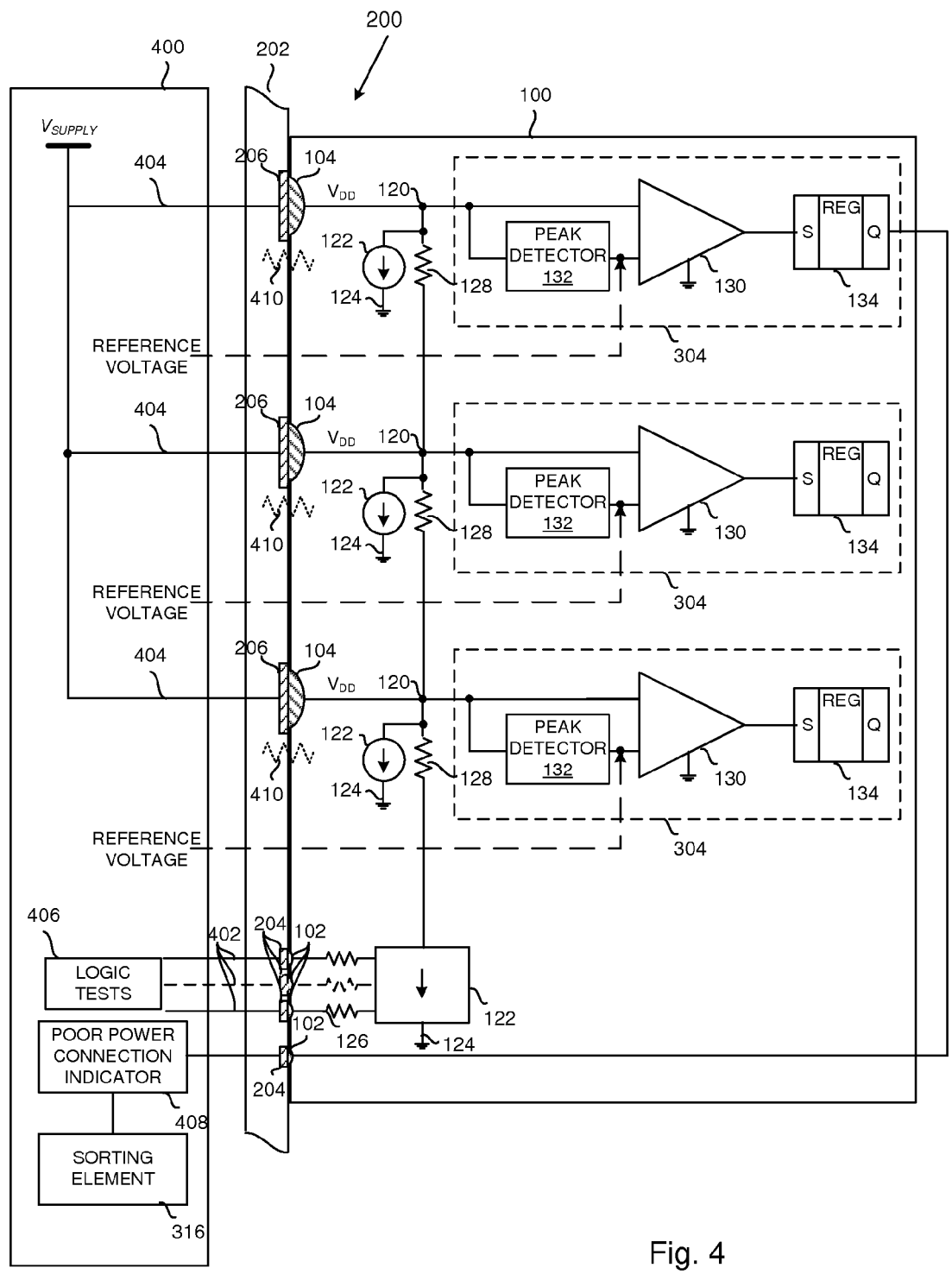
FIG. 4 is a schematic diagram of a product including an integrated circuit device and test apparatus in accordance with an embodiment of the invention, given by way of example.

Poor ATE power supply connection in a solder ball type of IC device is not usually representative of a functional defect in usage of the IC device, since the test power supply connection is merely a contact, whereas in use the solder balls are soldered to a support, such as a PCB. The ATE does not, of course, make a soldered connection to a commercial IC since the terminals 102, 104 and 105 could not be unsoldered, and it would make the IC 100 unusable. However, soldering defects can occur in the power supply connections when the IC device is subsequently mounted on its support which, if undetected can cause field failures but which, if detected, can often be avoided by re-working the soldering of the IC device on its support. In FIG. 4, such a soldering defect is illustrated by the resistor symbol 410 shown in dotted lines in FIG. 4.

FIG. 4 shows an application apparatus 400 including a test module 406 for testing an integrated circuit device 100 in a product 200 such as that shown in FIG. 2, for example, comprising a support 202 on which the integrated circuit device 100 is mounted, the product 200 being installed in the application apparatus. The application apparatus 400 comprises logic signal connectors 402 for electrical connection through the conductors 204 of the support 202 to the logic signal terminals 102 of the IC device 100, and power supply connectors 404 for electrical connection through the conductors 206 and 207 of the support 202 to the power supply terminal or terminals 104 and 105 of the IC device 100 to supply power to the integrated circuit.

As shown in FIG. 4, the IC device 100 may be identical to that of FIG. 3, except that its BGA solder balls 102 and 104 have been soldered to the support 202. The test module 406 may be different from the test apparatus 300 of FIG. 3, notably in that the logic signal connectors 402 and the power supply connectors 404 replace the probes 306 and the TAPs 308 and a poor connection indication element 408 replaces the poor connection indication element 312 for providing an indication in response to assertion of the poor connection signal from the internal connection verification module 304, the poor connection indication element 408 receiving the poor connection signal through the support 202. The logic test module 406 in the application apparatus 400 may apply different logic tests to the product 200 than does the logic test module 310.

In more detail, the example of IC device 100 shown in FIGS. 3 and 4 comprises logic circuits 122 connected between the nodes 120 and ground 124 and which in operation consume electric current provided through the power supply terminals 104. The logic circuits 122 are connected to the logic terminals 102 by connectors 126 having negligible resistance. The nodes 120 are connected to the corresponding power supply terminals 104 by the connectors having negligible resistance. In addition, power supply nodes 120 are interconnected by the connectors 128, having small but finite (i.e. non-negligible) resistance. The resistances of the connections between the terminals 102 and the logic circuits 122 and between the terminals 104 and the nodes 120 are assumed as negligible because the voltage drop on these connections is negligible in comparison with the voltage drop on the resistance of connector 128 in case of a poor connection 308-104, 105 or 206-104, 105.

The internal connection verification modules 304 comprise comparators 130, which have two inputs each. In one embodiment of the invention, one input of the comparator 130 is connected to receive the voltage at the corresponding node 120 directly and the other is connected to receive a reference voltage, which is the voltage at the node 120 provided through a peak detector 132. The peak detector applies a delay to the voltage at its input, so that the comparator 130 compares the voltages before and after the beginning of current consuming operation, and asserts a poor connection signal in case of significant difference between the voltages at the node 120 at low and high current consumption cases. The output of the comparator is stored in a register 134, whose output can be read out by any suitable way. In this example of an embodiment of the invention, the output of the register 134 is connected to the test apparatus 300 through one of the logic terminal solder balls 102.

In another embodiment of the invention, as shown in dotted lines, the reference voltage is provided externally by the test apparatus 300 or 400, through one of the logic terminals 102 or is generated internally inside the IC. The comparator 130 compares the voltage at the node 120 with this reference voltage, instead of a signal from a peak detector. Any poor connection between the test apparatus and the logic terminal affecting the reference voltage can be detected by any suitable test routine, such as an open-short test algorithm, for example, the current drawn by the inputs of the comparator 130 being small enough to be considered merely as probe signals and not significant in the current consumption.

In yet another embodiment of the invention, not shown, the reference voltage is provided internally by the IC device 100 itself at a position in the IC device which is less susceptible to voltage variation in presence of a poor power connection, for example a voltage, that powers another unloaded power domain, or produced by any other convenient stable voltage source, such as a band-gap circuit, for example. The comparator 130 compares the voltage at the corresponding node 120 with this internal reference voltage.

Figure 5:
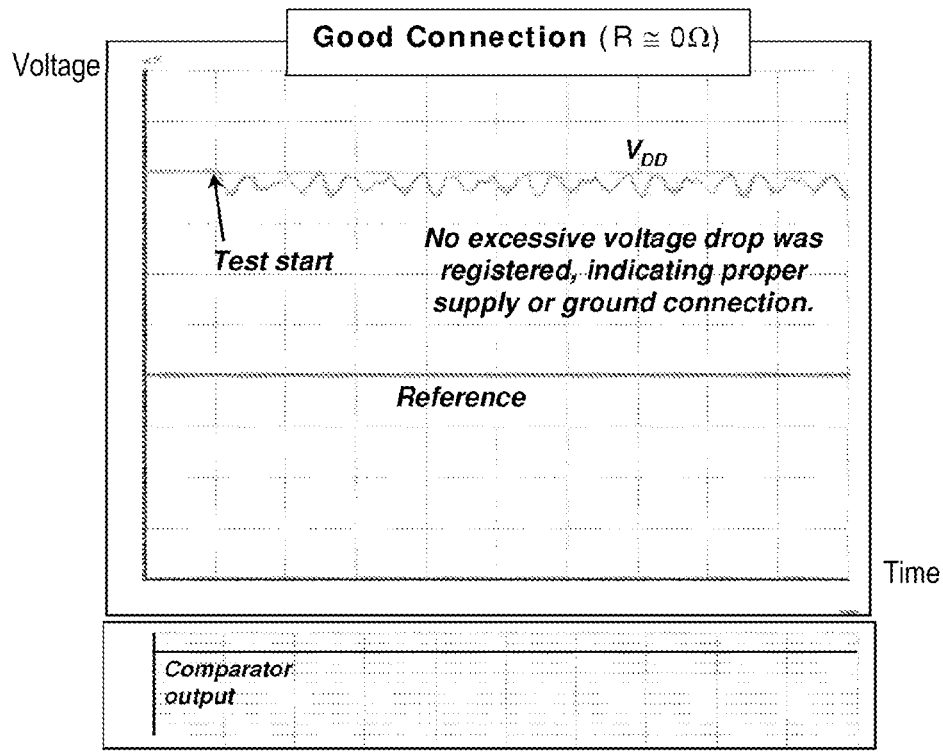
FIG. 5 is a schematic graph of signals obtained with a good power supply connection in a method of testing an integrated circuit and test apparatus in accordance with an embodiment of the invention, given by way of example.

FIG. 5 of the drawings is a graph of the voltage at the node 120 as a function of time after initial application of a voltage $V_{SUPPLY}$ by the ATE 300 or the application apparatus 400, in the case of good connections of one or more TAPs 308 to the corresponding power supply terminals 104 and 105 or a good solder joint between one or more conductors 404 and the corresponding terminals 104 and 105. The resistance of the connection 128 connecting the corresponding nodes 120 does not present a large voltage drop because the current consumed by the logic 122 flows through corresponding good connections 104, 105-308 or 404. The resistance of a good connection is small compared with the resistance of a poor connection of the ATE 300 or the application apparatus 400 to one of the terminals 104 or 105 and the voltage $V_{DD}$ fluctuates to a small extent as a function of the currents drawn by the logic circuits 122 and the relatively low impedance of the power supply current path 308 or 404-120. In the implementation whose operation is illustrated in FIG. 5, the voltage $V_{DD}$ fluctuates by less than 2%, which is acceptable, and the voltage $V_{DD}$ remains at a level of approximately 1.1V, considerably higher than a reference voltage of 0.9V.

Figure 6:
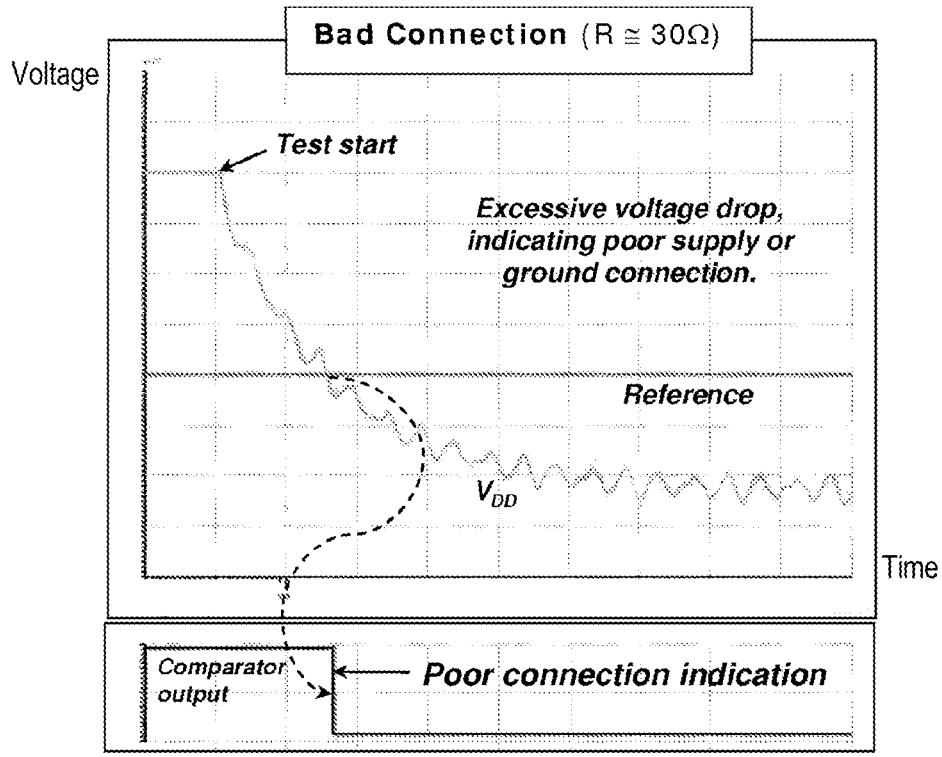
FIG. 6 is a schematic graph of signals obtained with a poor power supply connection in a method of testing an integrated circuit and test apparatus in accordance with an embodiment of the invention, given by way of example.

FIG. 6 of the drawings is a graph similar to FIG. 5 of the voltage at the node 120 as a function of time in the case of a poor connection of one of TAPs 308 to the corresponding power supply terminal 104 or 105 or of a poor solder joint between one of conductors 404 and the corresponding terminal 104 or 105. The resistance 314 between a TAP 308 and the corresponding power supply terminal 104 or 105 or between the conductor 404 and the corresponding poorly connected power supply terminal 104 or 105 (out of the total number of normally connected terminals) in this example of test is of the order of 30Ω. Within 15 nanoseconds from the start of the test, the voltage $V_{DD}$ has already fallen by 20%, due to the build-up of the voltage drop on the resistance 128, interconnecting the poorly connected node 120 with other, normally connected nodes 120 caused by the currents drawn by the logic circuits 122 (the current consumption of 1A for whole power domain in this example). This voltage drop can be detected as the difference of input voltages of the comparator 130 corresponding to the poor connection between the node 120 and the output of the peak detector 132 being greater than a threshold. In one example of an implementation of this embodiment of the invention, the threshold voltage was 200 mV, chosen as a function of the circuit design, being a minimal value, which allows elimination of false alarms due to operational noise). Alternatively, the voltage drop can be detected as the input voltage of the comparator 130 from the node 120 corresponding to the poor connection falling below a supplied reference voltage, such as 0.9V in this example.

Figure 7:
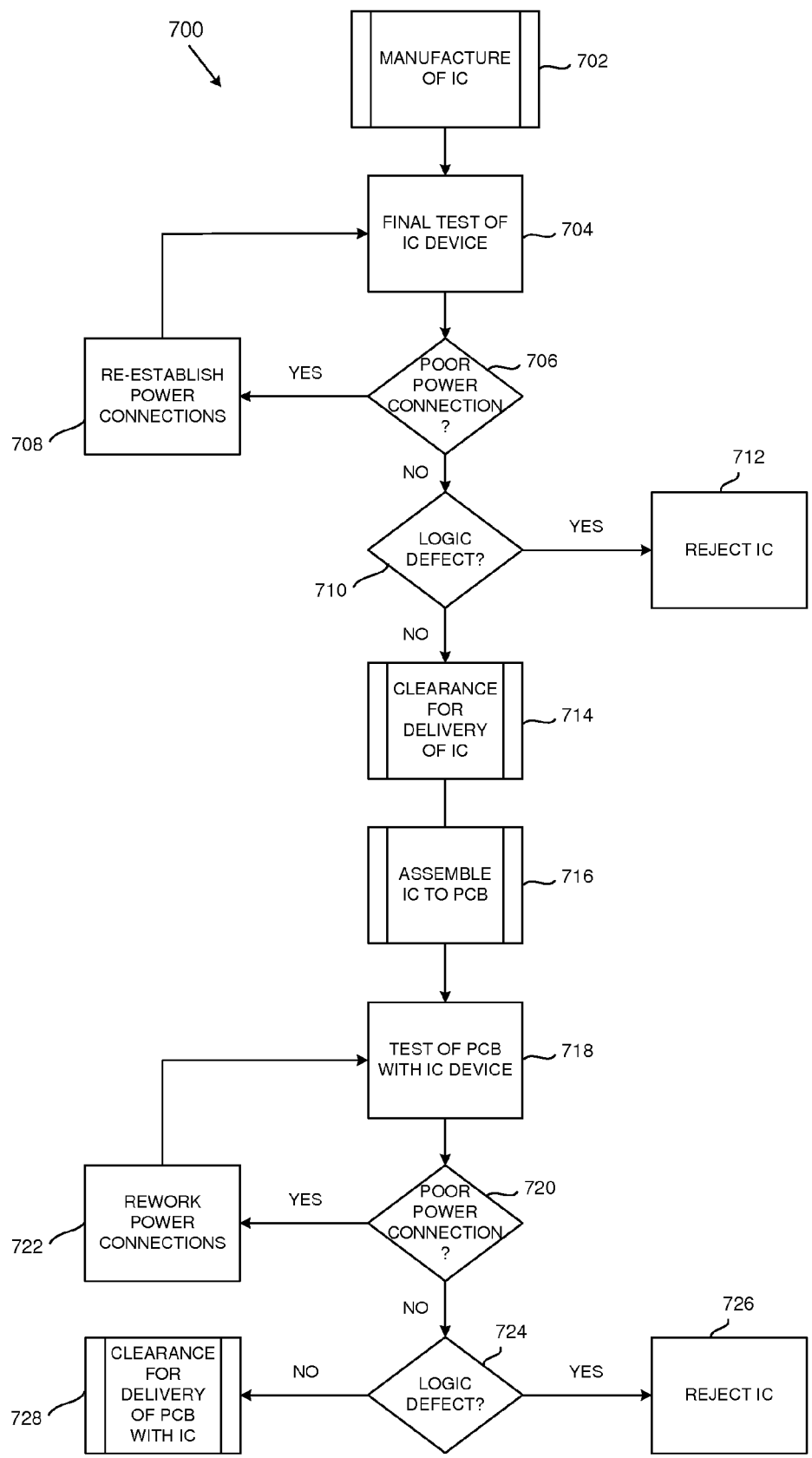
FIG. 7 is a schematic flow chart of a method of testing an integrated circuit and test apparatus in accordance with an embodiment of the invention, given by way of example.

FIG. 7 shows an example of a test procedure 700 in accordance with an embodiment of the invention. The test method illustrated commences after manufacture 702 of the IC device, in this example including packaging of the device 100, although it will be appreciated that the invention is also applicable to testing an IC device before packaging. The testing of the IC device 100 is performed at 704 by installing the IC device on a load board of the test apparatus 300, establishing the power supply connections such as the contact of the TAPs 308 with the solder ball terminals 104 and 105 and the contacts of the logic probe 306 with the logic terminal solder balls 102. The test apparatus 300 then applies the power supply voltage $V_{SUPPLY}$ to the power supply terminals 104 and 105 and sequences of logic test signals to the logic terminals 102.

At 706, a decision is made whether a poor connection signal or signals are asserted by the IC device 100 in response to a voltage difference between a voltage at one or more of the power supply nodes 120 and a reference voltage, the voltage difference being indicative of a poor connection of the power supply to that or those power supply terminals 104 or 105. If so, the connections of the test apparatus 300 to the IC device 100 are re-established at 708, to attempt to correct the poor connection or connections and the IC device 100 returns to the testing step 704. If no poor connection is detected, a decision is made at 710 whether a defect is detected in the logic functions of the IC device 100. If so, the IC device is rejected at 712. If no logic function defect is detected, the IC device 100 is cleared for delivery to the customer at 714.

It will be appreciated that the manipulations of the IC device 100 under test can be more or less automated. For example, the test apparatus 300 may include a sorting element 316 for rejecting or accepting the IC device in response to logic signals indicative of the presence or absence of a defect accompanied by non-assertion of the poor connection signal, and for processing the IC device distinctively in response to assertion of the poor connection signal. For example, in response to assertion of the poor connection signal, the sorting element 316 may trigger automatic re-establishment of at least the power supply connection of the test apparatus to the IC device 100 or directing the device under test to a separate bin. The test apparatus may include a poor connection indication element for providing an indication for an operator in response to assertion of the poor connection signal, instead of or as well as sorting the IC device 100 distinctively.

After clearance of the IC device 100 for delivery at 714, the IC device may be mounted on a support, such as a PCB, for example, as shown in FIG. 7 at 716, either after or before delivery to the customer. The product 200 comprising the support on which IC device 100 is mounted is then tested at 718 by installing the IC device on a load board of the application apparatus 400, establishing the power supply connections such as the connections 404 through the connectors 206 and 207 to the power supply terminal solder balls 104 and 105 and the connections 406 through the connectors 204 to the logic terminal solder balls 102. The test module 406 then causes the application apparatus to apply the power supply voltage to the power supply terminals 104 and sequences of logic test signals to the logic terminals 102.

At 720, a decision is made whether a poor connection signal or signals are asserted by the IC device 100 in response to a voltage difference between a voltage at one or more of the power supply nodes 120 and a reference voltage, the voltage difference being indicative of a poor connection of the power supply to the corresponding power supply terminal or terminals 104 or 105. If so, the connections of the support 202 to the IC device 100 are reworked at 722, to attempt to correct the poor connection and the product 200 returns to the testing step 704. If no poor connection is detected, a decision is made at 724 whether a defect is detected in the logic functions of the IC device 100. If so, the IC device is rejected at 726. If no logic function defect is detected, the product 200, including the IC device 100, is cleared for delivery to the customer at 728. The manipulations of the product 200 under test can again be more or less automated.

It will be appreciated that the steps 706 and 720 of detecting poor power connections may be performed during or even after detecting logic function defects. However, a reduction of test time and of usage of test resources may be obtained by performing the steps 706 and 720 of detecting poor power connections before detecting logic function defects.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

As used herein, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. If the logically true state is a logic level zero, the logically false state is a logic level one.

Where the apparatus implementing the present invention is composed of electronic components and circuits known to those skilled in the art, circuit details have not been explained to any greater extent than that considered necessary for the understanding and appreciation of the underlying concepts of the present invention.

Where the context admits, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Where the context admits, illustrated hardware elements may be circuitry located on a single integrated circuit or within a same device or may include a plurality of separate integrated circuits or separate devices interconnected with each other. Also, hardware elements in an embodiment of the invention may be replaced by software or code representations in an embodiment of the invention.

Furthermore, it will be appreciated that boundaries described and shown between the functionality of circuit elements and/or operations in an embodiment of the invention are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In the claims, any reference signs placed between parentheses shall not be construed as limiting the claim. Where the context admits, terms such as "first" and "second" are used to distinguish arbitrarily between the elements such terms describe and these terms are not necessarily intended to indicate temporal or other prioritization of such elements.

The invention claimed is:

1. An integrated circuit device comprising
a semiconductor die and
a package attached to the semiconductor die, the package including a plurality of terminals including a power supply terminal and a ground terminal,
wherein said semiconductor die includes
a power supply node coupled to said power supply terminal adapted to receive a supply voltage, and an internal connection verification module comprising a voltage comparator that determines a first voltage difference between said power supply node and a reference voltage, and asserts a poor connection signal when said first voltage difference is indicative of a poor connection between said power supply node and said power supply terminal, wherein said reference voltage includes a supply reference voltage associated with the supply voltage and a ground reference voltage associated with a supply ground, and, wherein said internal test connection verification module asserts said poor connection signal in response to a second voltage difference between said supply voltage at said voltage supply node and said supply reference voltage, and to a third voltage difference between said ground at said ground node and said ground reference voltage.

2. The integrated circuit device of claim 1, wherein said internal test connection verification module includes a register including a register output for registering assertion of said poor connection signal.

3. The integrated circuit device of claim 1, wherein said power supply terminal includes a solder ball contact.

4. The integrated circuit of claim 1, wherein the voltage comparator comprises a first input coupled to said power supply node, a second input coupled to said reference voltage, and an output to provide said poor connection signal.

5. The integrated circuit of claim 4, wherein said internal connection verification module includes a peak detector including an input to receive the voltage signal, and an output for providing the reference voltage.

6. The integrated circuit of claim 4, wherein said peak detector provides said reference voltage such that said reference voltage is a delayed version of said voltage signal at a first time when said voltage signal is indicative of a first load of said semiconductor die at said first time, and said voltage signal provided at said first input of said comparator is indicative of a second load of said semiconductor die at a second time, wherein the first load corresponds to lower circuit activity, and the second load corresponds to higher circuit activity.

7. The integrated circuit of claim 4, wherein said reference voltage is provided internally from said semiconductor die.

8. The integrated circuit of claim 7, wherein said reference voltage is provided from an unloaded power domain of said semiconductor die.

9. The integrated circuit of claim 4, wherein said reference voltage is provided via an external test apparatus.

10. A method comprising:

receiving, at a first input terminal of a voltage comparator of an internal connection verification module of a semiconductor die of an integrated circuit device, a voltage signal from a power supply node of the semiconductor die, receiving, at an input terminal of a peak detector of the internal connection verification module, the voltage signal, providing, at an output terminal of the peak detector, a delayed version of the voltage signal to a second input terminal of the voltage comparator, determining, by the voltage comparator, that a voltage difference between the voltage signal and the delayed version of the voltage signal is indicative of a poor connection between said power supply node and a power supply terminal of a package, wherein the power supply terminal is coupled to the power supply node, and wherein said integrated circuit device includes said semiconductor die included on said package; and asserting, at an output node of the voltage comparator, a poor connection signal in response to the determination.

11. The method of claim 10, further comprising:
determining to reject said integrated circuit device in response to asserting said poor connection signal.

12. The method of claim 10, wherein said voltage difference is a difference between a first voltage at said power supply node at a first time at which a first power consumption of said semiconductor die is different from a second voltage at said power supply node at a second time wherein said semiconductor die has a second power consumption, wherein the first power consumption corresponds to lower circuit activity, and the second power consumption corresponds to higher circuit activity.

13. The method of claim 10, wherein said voltage difference is a difference between a voltage at said corresponding node and a voltage at a position in said integrated circuit device which is less affected by supply current consumption of said semiconductor die.

14. The method of claim 10, further comprising:
applying logic signals to, and detecting logic signals from, logic signal terminals of said integrated circuit device; and
supplying power to said integrated circuit device during test through a contact to said power supply terminal.

15. The method of claim 10, further comprising:
mounting said integrated circuit device on a support;
applying logic signals to, and detecting logic signals from, logic signal terminals of said integrated circuit device through said support; and
supplying power for said integrated circuit device during test through said support to said power supply terminal.

16. The method of claim 10, wherein, in determining that said voltage difference is indicative of said poor connection signal, the method further comprises:
providing a voltage signal from said power supply node to a first input of a comparator;
providing the reference signal to a second input of said comparator; and
asserting said poor connection signal via an output of said comparator.

17. The method of claim 16, wherein, in determining that said voltage difference is indicative of said poor connection signal, the method further comprises:
providing said voltage signal to an input of a peak detector; and
providing said reference voltage via an output of said peak detector.

18. The method of claim 16, wherein said reference voltage is provided internally from said semiconductor die.

19. The method of claim 16, wherein said reference voltage is provided via an external test apparatus.

20. An integrated circuit device comprising
a semiconductor die and
a package attached to the semiconductor die, the package including a plurality of terminals including a power supply terminal,
wherein said semiconductor die includes
a power supply node coupled to said power supply terminal and
an internal connection verification module comprising,
a voltage comparator including a first input coupled to said power supply node, a second input coupled to reference voltage, and an output to provide said poor connection signal, wherein said voltage comparator determines a first voltage difference between said power supply node and a reference voltage, and asserts a poor connection signal when said first voltage difference is indicative of a poor connection between said power supply node and said power supply terminal, and a peak detector including an input to receive the voltage signal, and an output for providing the reference voltage, wherein said peak detector provides said reference voltage such that said reference voltage is a delayed version of said voltage signal at a first time when said voltage signal is indicative of a first load of said semiconductor die at said first time, and said voltage signal provided at said first input of said comparator is indicative of a second load of said semiconductor die at a second time, wherein the first load corresponds to lower circuit activity, and the second load corresponds to higher circuit activity.

* * * * *